(12) United States Patent
Bauer et al.

(10) Patent No.: US 11,514,204 B2
(45) Date of Patent: Nov. 29, 2022

(54) DYNAMIC DETERMINATION OF BUILDING FIT ON LOT PARCELS

(71) Applicant: TechSimple, LLC, Shelby Township, MI (US)

(72) Inventors: Steven Bauer, Shelby Township, MI (US); Anthony Lombardo, Shelby Township, MI (US)

( * ) Notice: Subject to any disclaimer, the term of this patent is extended or adjusted under 35 U.S.C. 154(b) by 29 days.

(21) Appl. No.: 16/658,221

(22) Filed: Oct. 21, 2019

(65) Prior Publication Data

US 2020/0050713 A1 Feb. 13, 2020

Related U.S. Application Data

(62) Division of application No. 16/136,654, filed on Sep. 20, 2018, now Pat. No. 10,452,791.

(60) Provisional application No. 62/615,876, filed on Jan. 10, 2018.

(51) Int. Cl.
| | | |
|---|---|---|
| *G06F 30/13* | (2020.01) | |
| *G06F 3/0482* | (2013.01) | |
| *G06T 17/05* | (2011.01) | |
| *G06Q 50/08* | (2012.01) | |
| *G06Q 50/16* | (2012.01) | |
| *G06Q 10/10* | (2012.01) | |
| *G06Q 10/06* | (2012.01) | |

(52) U.S. Cl.
CPC ............ *G06F 30/13* (2020.01); *G06F 3/0482* (2013.01); *G06Q 10/06* (2013.01); *G06Q 10/10* (2013.01); *G06Q 50/08* (2013.01); *G06Q 50/16* (2013.01); *G06T 17/05* (2013.01)

(58) Field of Classification Search
CPC ....... G06F 30/13; G06F 3/0482; G06Q 10/06; G06Q 10/10; G06Q 50/08; G06T 17/05
See application file for complete search history.

(56) References Cited

U.S. PATENT DOCUMENTS

| | | | | |
|---|---|---|---|---|
| 6,056,556 | A | * | 5/2000 | Braun ...................... G09B 7/04 345/644 |
| 2002/0010522 | A1 | | 1/2002 | Martin |
| 2003/0009315 | A1 | | 1/2003 | Thomas et al. |
| 2004/0004611 | A1 | * | 1/2004 | Komornicki ............ G06F 16/29 345/418 |
| 2005/0081161 | A1 | * | 4/2005 | MacInnes ................ G06K 9/00 715/765 |
| 2005/0114017 | A1 | | 5/2005 | Putnam |
| 2006/0025971 | A1 | | 2/2006 | Detwiler |

(Continued)

FOREIGN PATENT DOCUMENTS

AU 2005217987 12/2005

OTHER PUBLICATIONS

International Preliminary Report on Patentability for International Application No. PCT/US2019/013009 dated Jul. 23, 2020.

(Continued)

*Primary Examiner* — Chuen-Meei Gan
(74) *Attorney, Agent, or Firm* — Carlson, Gaskey & Olds, P.C.

(57) ABSTRACT

A computer program, system, or method is configured for dynamically determining lot-fit. A display shows whether a selected baseline building design with selected building modification options fits within one or more permissible build envelopes of one or more lot parcels.

13 Claims, 10 Drawing Sheets

(56) References Cited

U.S. PATENT DOCUMENTS

| | | |
|---|---|---|
| 2006/0075718 A1 | 4/2006 | Borne |
| 2006/0149687 A1* | 7/2006 | McLemore ........ G06Q 30/0603 |
| | | 705/400 |
| 2008/0262988 A1* | 10/2008 | Williams ................ G06N 3/12 |
| | | 706/13 |
| 2009/0037834 A1* | 2/2009 | Parrish .................... G06T 11/60 |
| | | 715/771 |
| 2010/0070244 A1* | 3/2010 | Nicolucci .............. G06Q 50/16 |
| | | 703/1 |
| 2010/0205555 A1 | 8/2010 | Nielsen et al. |
| 2012/0330621 A1 | 12/2012 | Detwiler et al. |
| 2013/0077819 A1* | 3/2013 | Du ....................... G06K 9/4661 |
| | | 382/103 |
| 2013/0179206 A1 | 7/2013 | Harper |
| 2014/0278280 A1 | 9/2014 | Pardo-Fernandez |
| 2014/0280069 A1* | 9/2014 | Schoen ................ G06F 16/248 |
| | | 707/722 |
| 2016/0110824 A1 | 4/2016 | Zabala Rodriguez |
| 2017/0263034 A1* | 9/2017 | Kenoff ................ G06F 3/04842 |
| 2018/0025452 A1* | 1/2018 | Fadeev ................ G06Q 50/165 |
| | | 705/315 |

OTHER PUBLICATIONS

International Search Report and Written Opinion for International Application No. PCT/US2019/013009 completed Feb. 28, 2019.

* cited by examiner

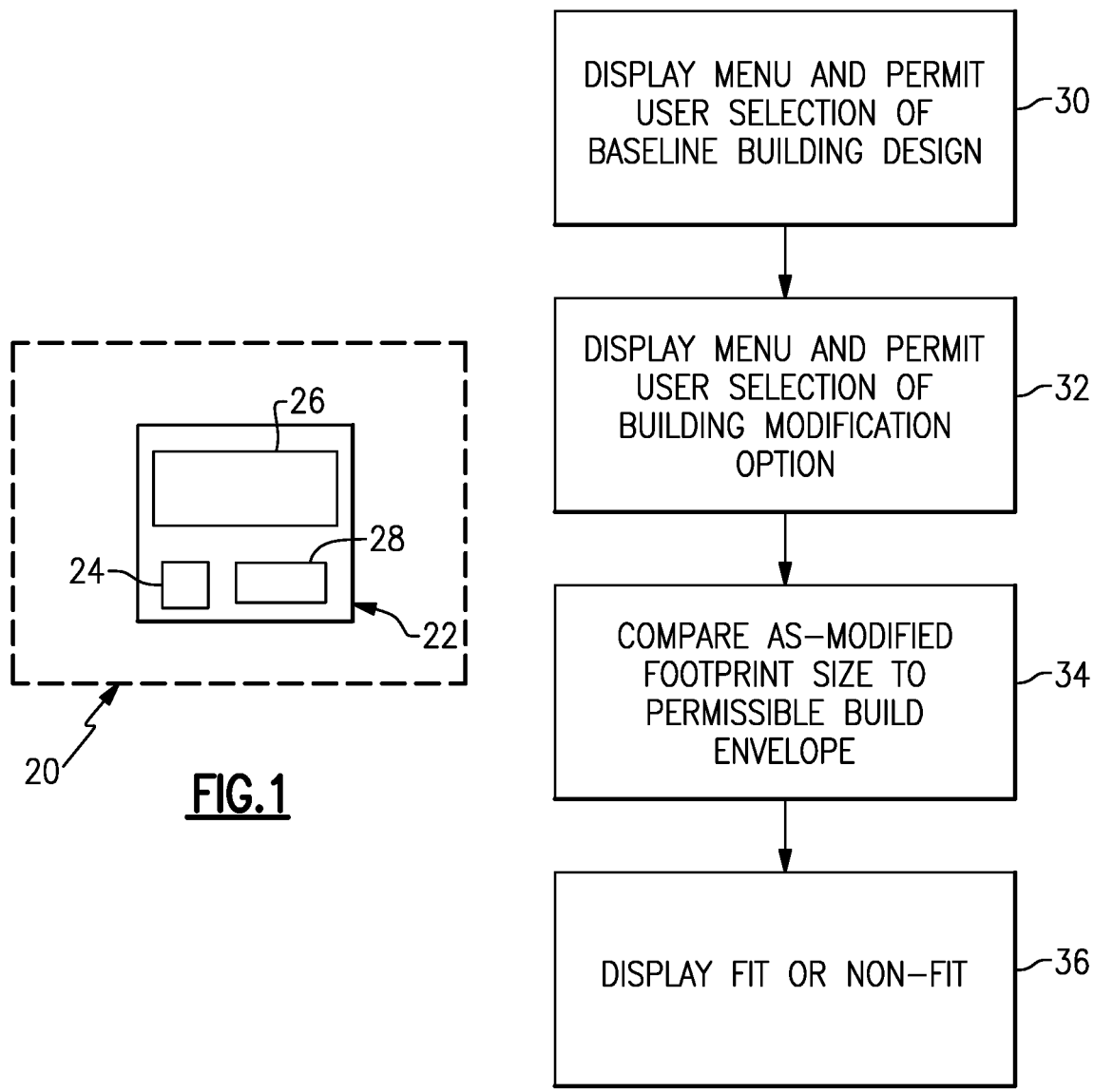

DYNAMIC DETERMINATION OF BUILDING FIT ON LOT PARCELS

CROSS-REFERENCE TO RELATED APPLICATION

This application is a divisional of application Ser. No. 16/136,654, filed Sep. 20, 2018, with as an issue date of Oct. 22, 2019; and claims priority to U.S. Provisional Application No. 62/615,876 filed on Jan. 10, 2018.

BACKGROUND

The process for a new home construction often involves the homeowner, homebuilder, or other stakeholder choosing a lot and making a series of design decisions on the home. Typically, the homeowner or homebuilder selects a lot from those available in a community and a baseline home design from a menu of different baseline home designs. The choosing of the lot, the baseline home design, and design options are not completely independent though. Some of the design options may alter the size of the baseline home. And some of the available lots in the community may not be of suitable shape or size to fit the altered home size. However, it is not until after many of these decisions have been made that the homeowner or homebuilder may find out that their home does not fit the lot they selected. As a result, in addition to lost time, the user must go back and choose new design options, hoping that the new options will lead to a fit on the lot. In addition to being inefficient, this can be frustrating because the design choices are divorced from the lot selection and fitting.

SUMMARY

A computer program, system, or method for dynamically determining lot-fit according to an example of the present disclosure displays a menu of baseline building designs and permits a user to select one of the baseline building designs. A menu of baseline building designs is displayed and a user is permitted to select one of the baseline building designs. The baseline building designs have corresponding digital design files saved in a memory, and the digital design files include baseline footprint sizes of the baseline building designs. A menu is displayed of building modification options that are linked to the selected baseline building design, and a user is permitted to select one of the building modification options. The digital design files include as-modified footprint sizes of the baseline building designs with each of the building modification options that is linked to the respective baseline building design. The as-modified footprint size of the selected building modification option for the selected baseline building design is compared to one or more permissible build envelopes of one or more lot parcels. The lot parcels have corresponding digital lot files that are saved in the memory and contain the permissible build envelopes. A display shows whether the selected baseline building design with the selected building modification option fits within the one or more permissible build envelopes of the one or more lot parcels.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 1 illustrates an example system for dynamically determining lot-fit.

FIG. 2 illustrates an example method for dynamically determining lot-fit.

DETAILED DESCRIPTION

Figure 3:
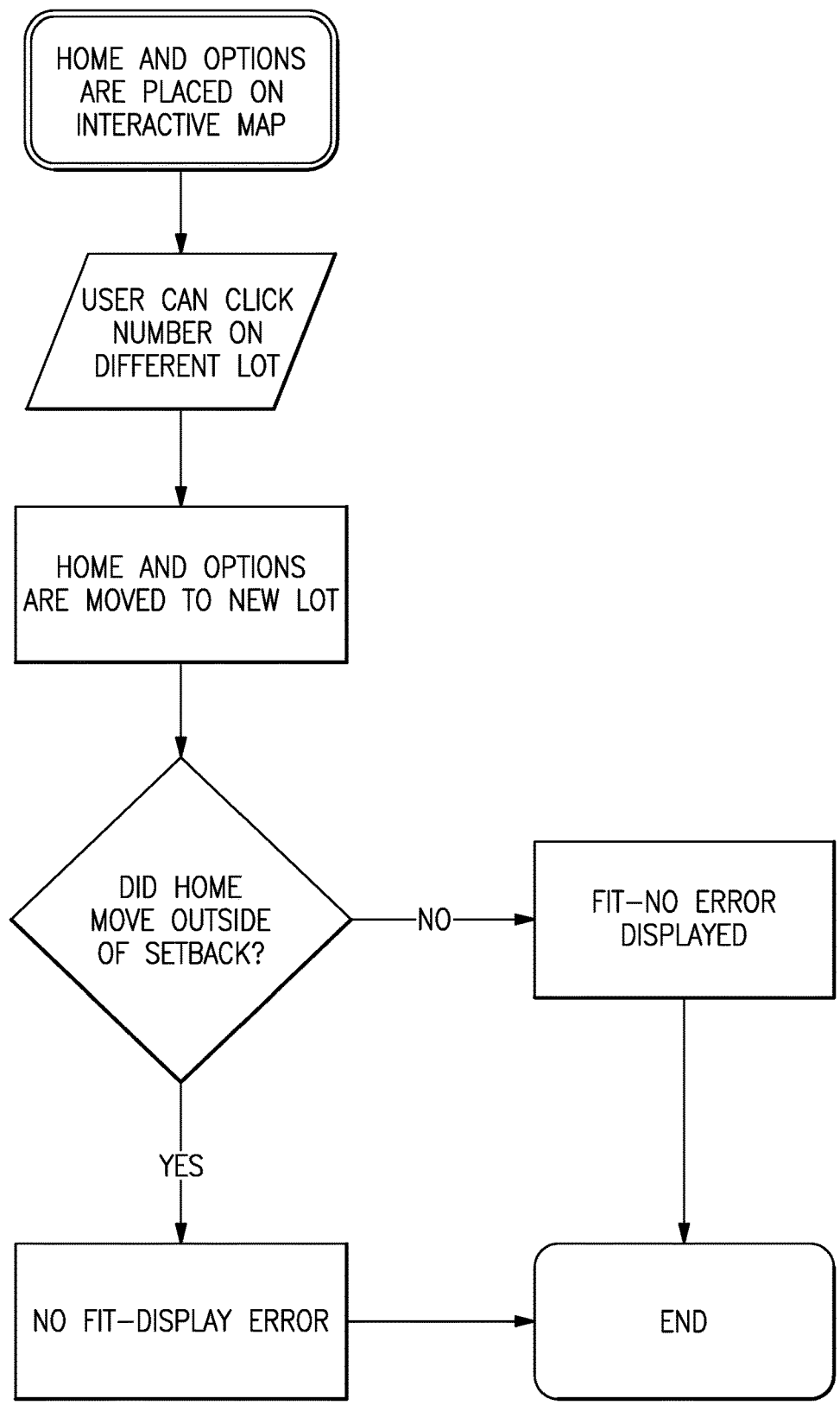
FIG. 3 illustrates a block diagram of a method for determining whether a selected baseline building design with selected building modification options fits within a permissible build envelope of a lot parcel.

One or more of the problems addressed herein is rooted in graphical interfaces and computer technology designed to improve computer operation. As an example, one could view home designs and their design options and one could separately view lot parcels and their characteristics, perhaps even on computers. There was, however, little or no integration of these two activities and certainly no integration that combined and enhanced the activities. As will be appreciated, the examples herein marry home designing and lot fitting in one graphical, computerized solution in which a user, such as a homeowner or homebuilder, can choose design options for a baseline home and dynamically receive feedback on whether the home, as modified by the selected options, fits one or more lot parcels. The user can thereby make design decisions contemporaneously with lot parcel selection and fitting. Of course, this disclosure is not limited to homes, and may be adapted for commercial real estate and buildings or other structures.

FIG. 1 illustrates an example system 20 for dynamically determining lot-fit. The system 20 includes a computing device 22 that at least has a processor 24 (e.g., a microprocessor), an electronic graphic 26 (e.g., an electronic screen or monitor) and a memory 28. The memory 28 may include a non-transitory computer-readable media, and/or the computing device 22 may utilize remote or cloud-based non-transitory computer-readable media. The computing device 22 (the processor 24, electronic graphic 26, and memory 28) may be contained in a single user device, such as a computer, tablet, or mobile device, or the computing device 22 may be distributed across a network among multiple devices. The computing device 22 may additionally include one or more network devices, input and/or output devices, and one or more user interfaces.

The computing device 22 is configured to execute one or more computer programs that include software encoded in the non-transitory computer-readable media, where the software includes instructions for carrying out the functions according to the present disclosure. It is to be understood that the following examples may be embodied in the system 20, in a method, and/or in one or more computer programs.

The system, method, or program is operable to dynamically determine building fit on lot parcels. For instance, as will be described in the following examples, the determination can be performed for an individual lot parcel or across a group of lot parcels in a community. More generally, this determination will include the following steps, as shown in the block diagram of FIG. 2.

First, at block 30, there is a display to a user of a menu of baseline building designs. Most typically, the baseline building designs are predetermined home designs established by a builder for a given community of lot parcels. As an example, the menu may list the baseline building designs by name and/or by other representations, such as pictures. If the community is not already preselected, the user may be presented with a menu of communities to choose from before choosing a baseline building design. The baseline building designs may vary by community and each community may have associated therewith a unique set of baseline building designs.

The user is permitted at block 30 to select one of the baseline building designs. For example, this may include touching or clicking on one of the baseline building designs to select that design. The baseline building designs have corresponding digital design files saved in the memory 28. The digital design files include baseline footprint sizes of the baseline building designs. For instance, the digital design files are computer-aided design (CAD) files, such as .dwg files. The baseline footprint sizes may be designated by length (X) and width (Y) dimensions.

Next, at block 32, there is a display of a menu of building modification options that are linked to the selected baseline building design. That is, each baseline building design has one or more corresponding building modification options associated therewith. For example, one or more of the options, or all of the options, may be unique to a given baseline building design in terms of the location and/or size of the option with respect to the selected baseline building design. Such options may include 2 or 3 car garage, addition of in-law quarters, addition of a larger kitchen, addition of an office, etc. As will be appreciated, these options are not limiting and are given merely to demonstrate the kinds of options that may affect lot fitting. The options may include any add-on to the baseline building design that changes its building footprint size.

Similar to the menu for the baseline building designs, the menu for the building modification options may list the building modification options by name and/or by other representations, such as pictures. The user is then permitted in block 32 to select one or more of the building modification options from the menu. For example, this may include touching or clicking on the building modification option to select that option.

The digital design files further include as-modified footprint sizes of the baseline building designs with each of the building modification options that is linked to the respective baseline building design. That is, for each combination of a baseline building design and its building modification options there is an as-modified footprint size. Thus, a baseline building design A may have building modification options M, N, and Q such that there are as-modified footprint sizes for combinations A-M, A-N, A-Q, A-M-N, A-N-Q, and so on and so forth. There may be conditions imposed for such selections where certain options are incompatible with each other and cannot both be selected. There would be no as-modified footprint sizes for impermissible combinations.

The as-modified footprint size represents the size of the baseline building design altered by the presence of the particular building modification option or options. In some cases, the as-modified footprint size may be smaller than or approximately equal to the baseline footprint size. More typically though, the as-modified footprint size will be larger than the baseline footprint size and may alter how and whether the baseline building design with a particular building modification option fits on a particular lot parcel. As an example, the as-modified footprint size may be designated by length (X) and width (Y) dimensions in the digital design file.

Next, at block 34, the as-modified footprint size for the selected baseline building design is compared to one or more permissible build envelopes of one or more lot parcels. This comparison may be performed by the processor 24, for example. In this regard, the lot parcel or parcels have corresponding digital lot files that are saved in the memory 28 and that contain the permissible build envelopes. As an example, the permissible build envelopes are defined by offsets from the boundaries of the lot parcels and are often regulated by community charter. Common offsets require 1) that the home be a particular distance from the front boundary at the road, 2) that the home be no closer than a set buffer distance to the side boundaries, and 3) that the home be at least a set distance from the back boundary. The permissible build envelopes may be designated by length (X) and width (Y) dimensions in the digital lot files.

As an example, the comparison of the as-modified footprint size to the permissible build envelope of a lot parcel includes obtaining the length (X) and width (Y) dimensions of the as-modified footprint size and of the permissible build envelope and then determining whether either of the length (X) and width (Y) dimensions of the as-modified footprint size exceed the length (X) and width (Y) dimensions of the permissible build envelope. If the length (X) of the as-modified footprint size exceeds the length (X) of the permissible build envelope, the selected baseline building design with the selected building modification option is a non-fit. If the width (Y) of the as-modified footprint size exceeds the width (Y) of the permissible build envelope, the selected baseline building design with the selected building modification option is a non-fit. If the length (X) and width (Y) of the as-modified footprint size are equal to or less than, respectively, the length (X) and width (Y) of the permissible build envelope, the selected baseline building design with the selected building modification option is fit.

At block 36, in response to the determination made in the comparison in block 34, there is a display on the electronic graphic 26 of whether the selected baseline building design with the selected building modification option fits within the one or more permissible build envelopes of the one or more lot parcels. The display, or indicator, can take many forms, such as but not limited to, a graphic of the lot parcel or parcels with color coding that is indicative of fit or non-fit (e.g., green and red). This may further include graphic(s) of the permissible build envelope(s) and graphic(s) of the selected baseline building design with the selected building modification option on or within the permissible build envelope(s).

In one further example, the graphic of the selected baseline building design with selected building modification options may be shown on a selected lot parcel but the selected lot parcel may be depicted on a map of the community along with other lot parcels that were not selected. In this case, the user is permitted to graphically move the selected baseline building design with the selected building modification options within the build envelope of the selected lot parcel by dragging the graphic of the selected baseline building design with the selected building modification options within the build envelope. If a new lot is desired, the user can click on a different lot, and the selected baseline building design with the selected building modification options will move to that lot, where the user can likewise move the design within that build envelope.

In response to the dropping of the selected baseline building design with the selected building modification options, the system runs the comparison of block 34 for the new lot parcel, to compare the as-modified footprint size to the permissible build envelope of the new lot parcel. The electronic graphic 26 is then refreshed to display whether the selected baseline building design with the selected building modification options fits within the permissible build envelope of the new lot parcel. This process is also depicted in FIG. 3, in which the as-modified building design is depicted on the electronic graphic 26 and the user can click on a different lot parcel in the interactive map in order to move the as-modified buiding design to the new lot. Alternatively, the user can select a new lot parcel from a menu.

Figure 4:
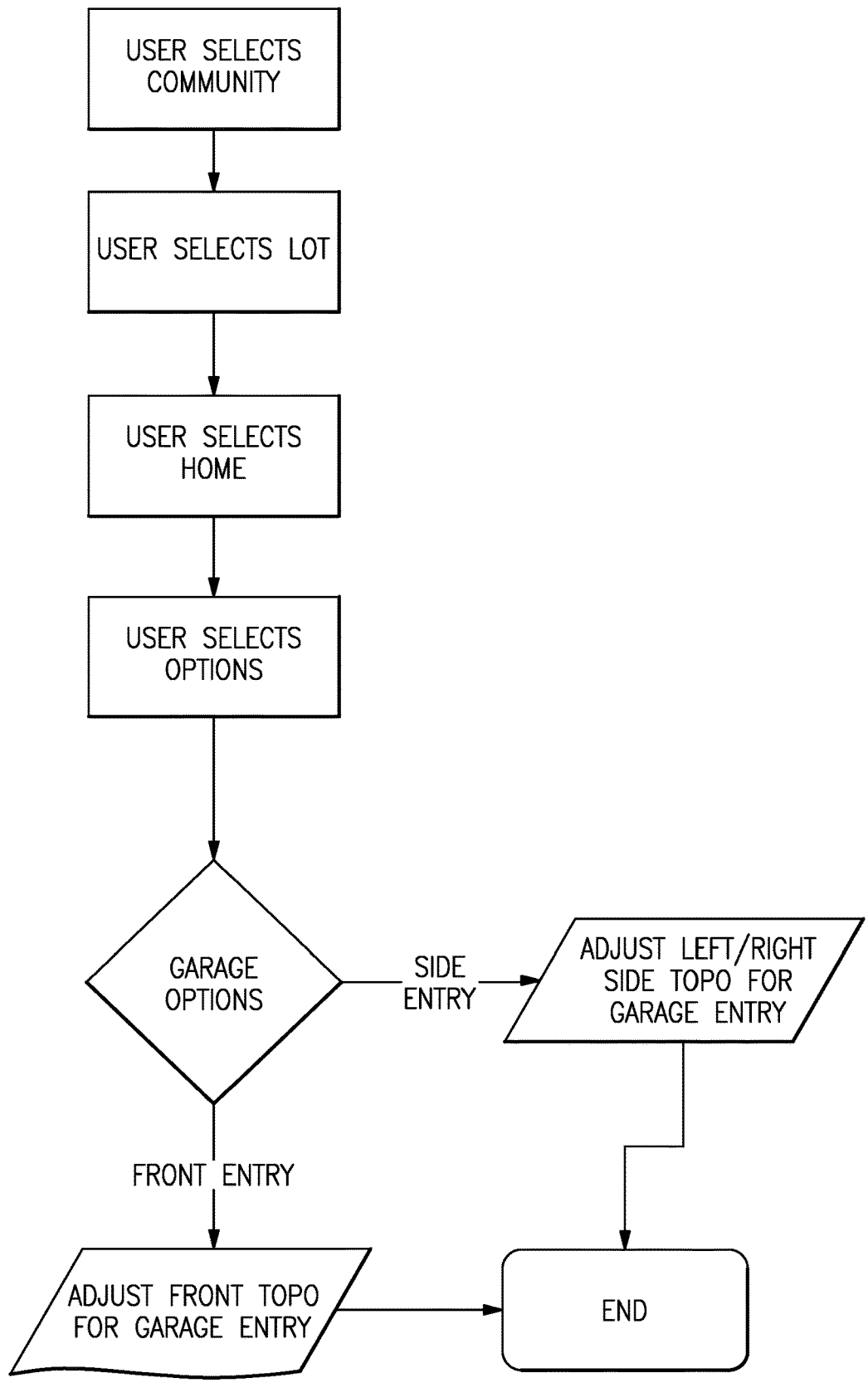
FIG. 4 illustrates a block diagram of a method related to displaying a graphic of a driveway leading from the garage of the selected baseline building design and selectively altering the driveway and garage orientation.

The display may also depict a graphic of a driveway leading from the garage of the selected baseline building design with the selected building modification options to the road. The driveway and the garage orientation may also be altered by the user, as depicted in FIG. 4. For example, the user may select/toggle between a side-entry configured garage and a front entry configured garage. In response to the selection, the display of the driveway can be changed to show either a side- or front-entry configuration. In a further example, if the selected baseline building design with the selected building modification options has a side-facing garage and driveway, and the driveway exceeds the permissible build envelope of the lot parcel that the selected baseline building design with the selected building modification options is dropped onto, the garage is automatically reverted to the default in which the garage is front-facing. This has the effect of moving the driveway to the front and thus reduces the as-modified footprint size, although the as-modified footprint may exceed the permissible build envelope at other locations. Alternatively, if the selected driveway configuration exceeds the permissible build envelope, the user can toggle to another configuration to eliminate the issue.

Figure 5:
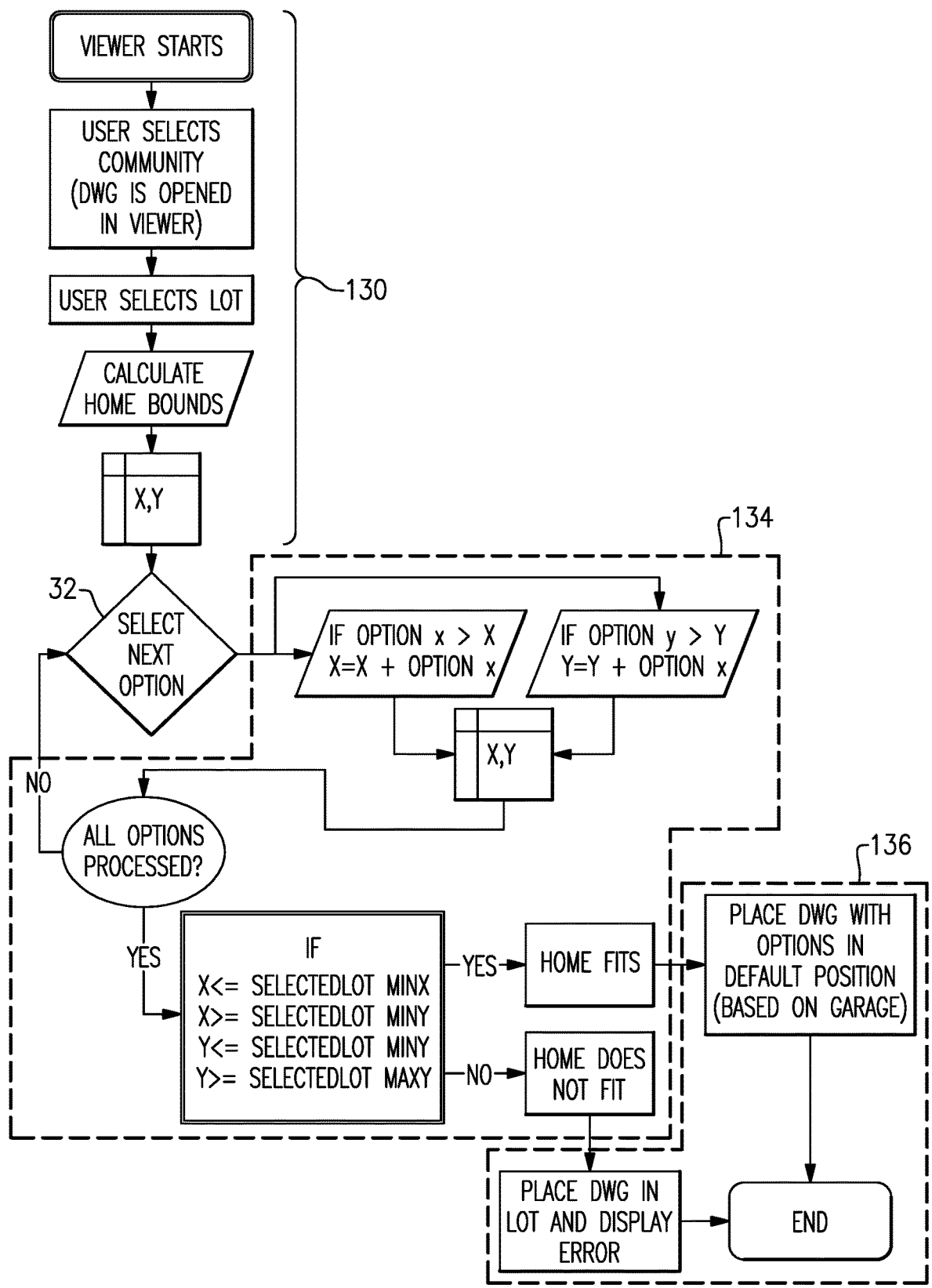
FIG. 5 illustrates a block diagram for a lot-fit determination for an individual lot parcel.

As mentioned above, this lot-fit determination can be performed for an individual lot parcel or across a group of lot parcels in a community. The following example in FIG. 5 demonstrates a flow diagram for a lot-fit determination for an individual lot parcel. In this disclosure, like reference numerals designate like elements where appropriate and reference numerals with the addition of one-hundred or multiples thereof designate modified elements that are understood to incorporate the same features and benefits of the corresponding elements. In this example, block 130 includes the display and selection of the baseline building design as described above for block 30, however, block 130 here additionally includes selection of the community of lot parcels, selection of a particular lot parcel, and a calculation of the home bounds. For example the calculation may include extracting information from one or more of the digital design files and then determining the baseline footprint size dimensions based on the extracted information. As above, the size may be in the form of length (X) and width (Y) dimensions.

Block 32 is as described above. Block 134 here includes the comparison as discussed above but also shows example logic underlying the comparison. In this example, if the length (X) of the as-modified footprint size is greater than the length (X) of the baseline footprint size, then the length (X) of the as-modified footprint size is used for the later comparison. Similarly, if the width (Y) of the as-modified footprint size is greater than the width (Y) of the baseline footprint size, then the width (Y) of the as-modified footprint size is used for the later comparison. Otherwise, the length (X) or width (Y) of the baseline footprint size is used. The comparison is then made with the length (X) and width (Y) of the permissible build envelope of the selected lot parcel from block 130 to result in a determination of whether the selected baseline building design and selected building modification options are a fit or non-fit.

Figure 6:
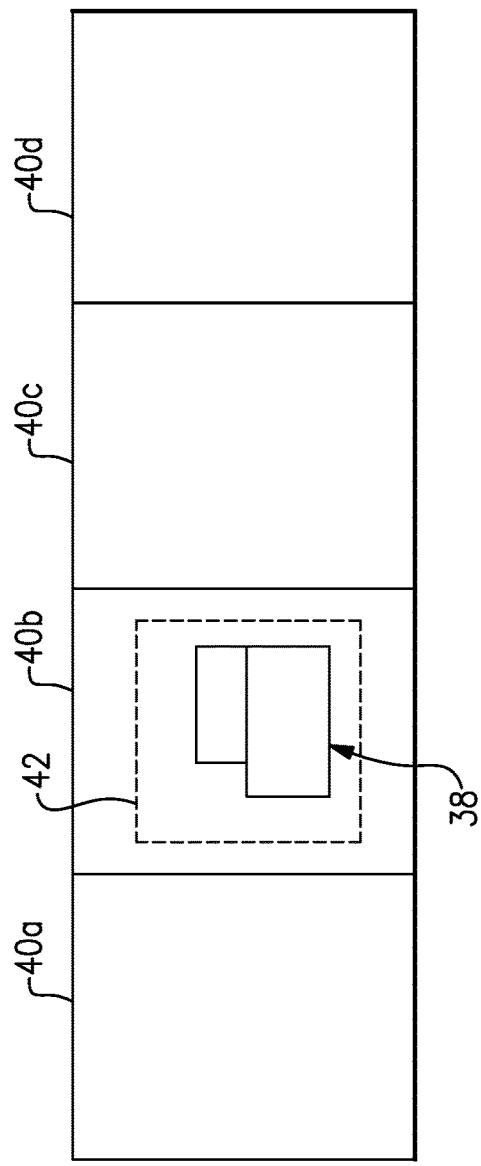
FIG. 6 illustrates a display of a graphic of a selected baseline building design with selected building modification options on a selected lot parcel within a permissible build envelope.

Block 136 here includes the display as discussed above for block 36 but also shows example logic underlying the display step. In this example, if there is a fit, a graphic of the selected baseline building design with selected building modification options is depicted on the selected lot parcel within the permissible build envelope. An example of such a graphic is shown in FIG. 6, which depicts lot parcels 40*a*/40*b*/40*c*/40*d* in a community. In this case, the selected baseline building design with selected building modification options (represented at 38) is depicted on the selected lot parcel 40*c* within permissible build envelope 42.

Figure 7:
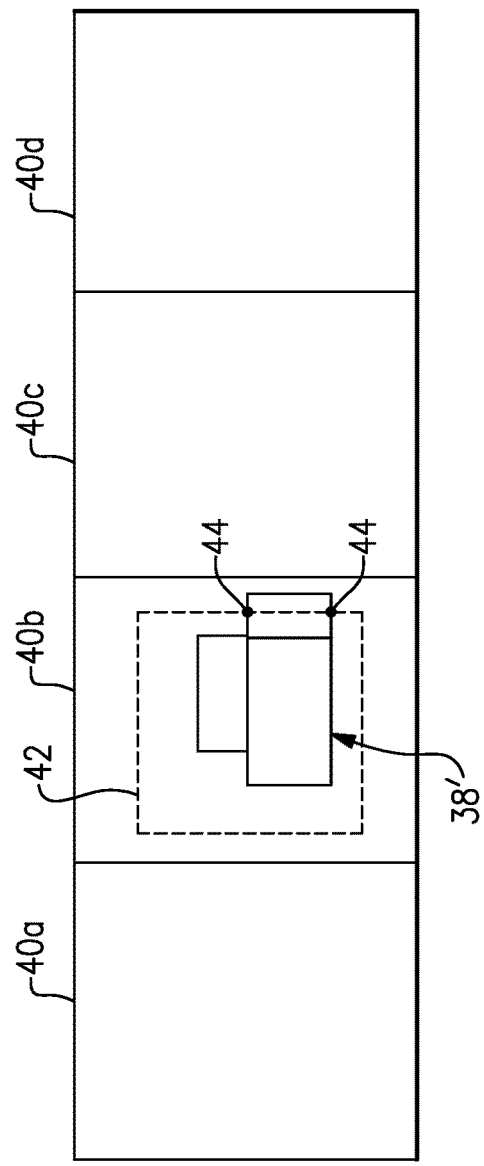
FIG. 7 illustrates a display of a graphic of a selected baseline building design with selected building modification options on a selected lot parcel in which there is a non-fit in a permissible build envelope.

The placement in the permissible build envelope may be dictated by a predefined default position. As an example, the predefined default position may be based on the garage of the selected baseline building design with the selected building modification options. For instance, a front-facing garage may have a first default position, while as side-facing garage may have a second, different default position. If there is a non-fit, a graphic of the selected baseline building design with selected building modification options is depicted on the selected lot parcel as exceeding one or more bounds of the permissible build envelope. As an example, the locations where the envelope is exceeded may be designated with visual markers to graphically show the user where the selected baseline building design with selected building modification options violates the envelope. An example of such a graphic is shown in FIG. 7, which again depicts lot parcels 40*a*/40*b*/40*c*/40*d* in a community. In this case, the selected baseline building design with selected building modification options (represented at 38') is depicted on the selected lot parcel 40*c*. However, the footprint exceeds one or more bounds of the permissible build envelope 42. The locations where the envelope 42 is exceeded are designated with visual markers 44 to graphically show the user where the selected baseline building design with selected building modification options violates the envelope 42. In this example, the visual markers 44 are symbols, such as dots or even X's, located at the intersections of the footprint of the selected baseline building design with selected building modification options with the permissible build envelope 42.

Figure 8:
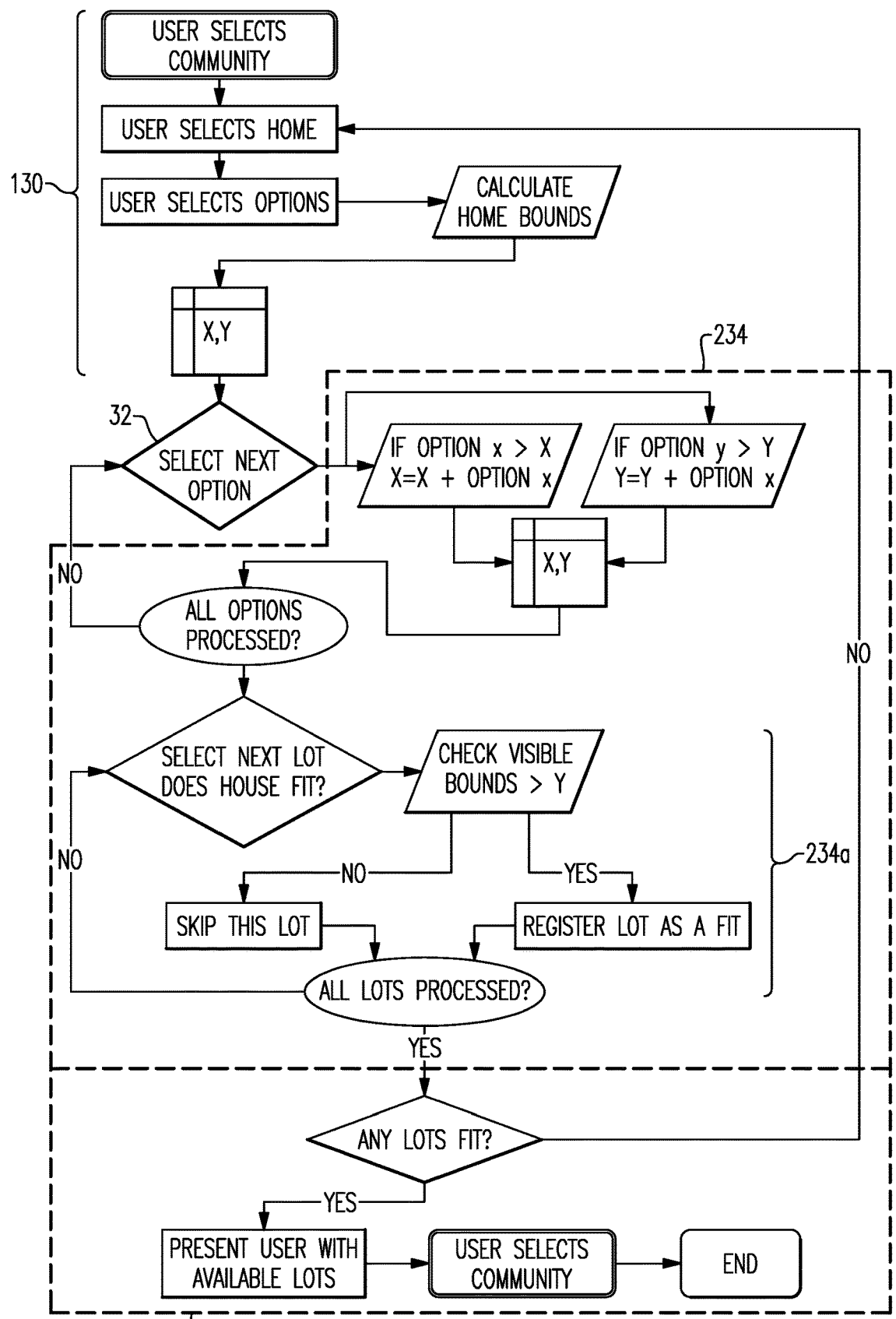
FIG. 8 illustrates a block diagram for a lot-fit determination for a plurality of lot parcels in a community.

The following example in FIG. 8 demonstrates a flow diagram for a lot-fit determination for a plurality of lot parcels in a community. In this example, blocks 130 and 32 are as described above. Block 234 is as described above for block 134 but additionally includes an iteration loop 234a. The iteration loop 234a conducts the comparison as described above, but for each lot parcel of the selected community until the comparison has been made to all of the lot parcels. In each iteration, the determination of fit is saved in memory 28 for each individual lot parcel.

Figure 9:
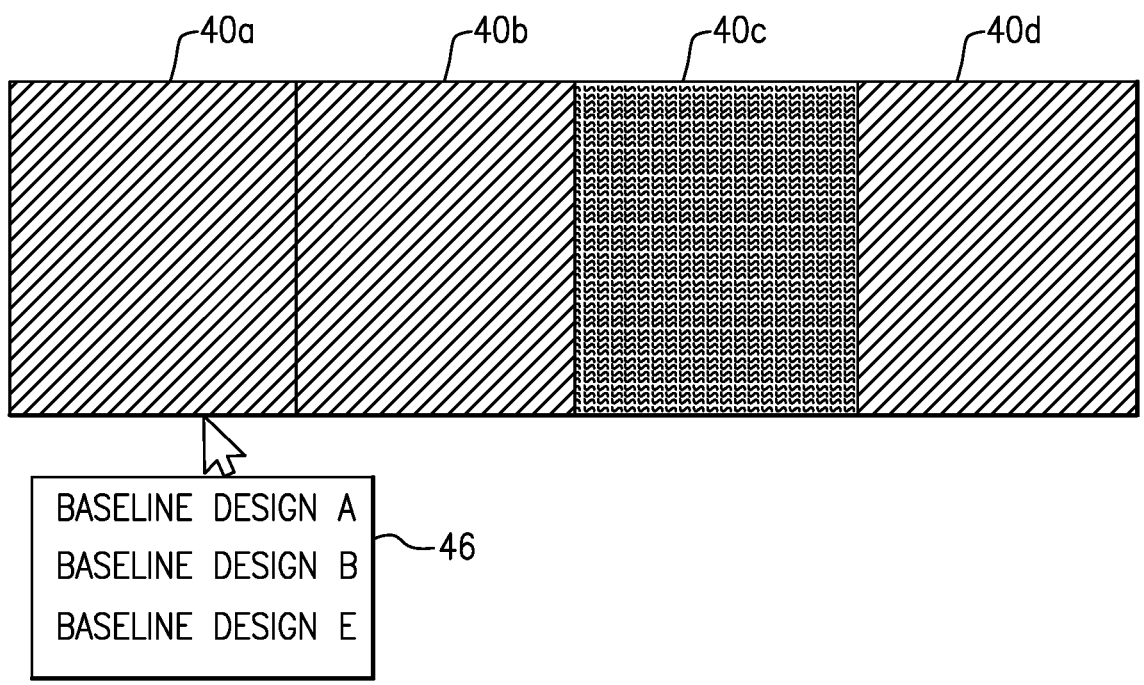
FIG. 9 illustrates a graphic in which lot parcels are shown with indicators of whether there is a fit or non-fit.

Then, at block 236 the display shows all of the lot parcels of the selected community that are a fit for the selected baseline building design with selected building modification options. This can be accomplished by displaying a list of the lots that fit, or alternatively by displaying a map view with indication whether there is a fit or non-fit in each lot as described above. Alternatively, the graphic may not be shown, but the lot parcels are shown with indicators of whether there is a fit or non-fit. As an example, the indicators may be color coding (e.g., green for fit and red for non-fit). For instance, as shown in FIG. 9, each lot parcel 40a/40b/40c/40d is depicted with a different pattern or color that is indicative of fit or non-fit. In the example shown, lot parcels 40a/40c/40d are a non-fit and lot parcel 40c is a fit. Additionally or alternatively, fits can be indicated via a pop-up window 46 that appears when a mouse pointer hovers over the lot parcel. For instance, the window 46 displays which baseline designs will fit the lot parcel over which the mouse pointer is hovering.

Figure 10:
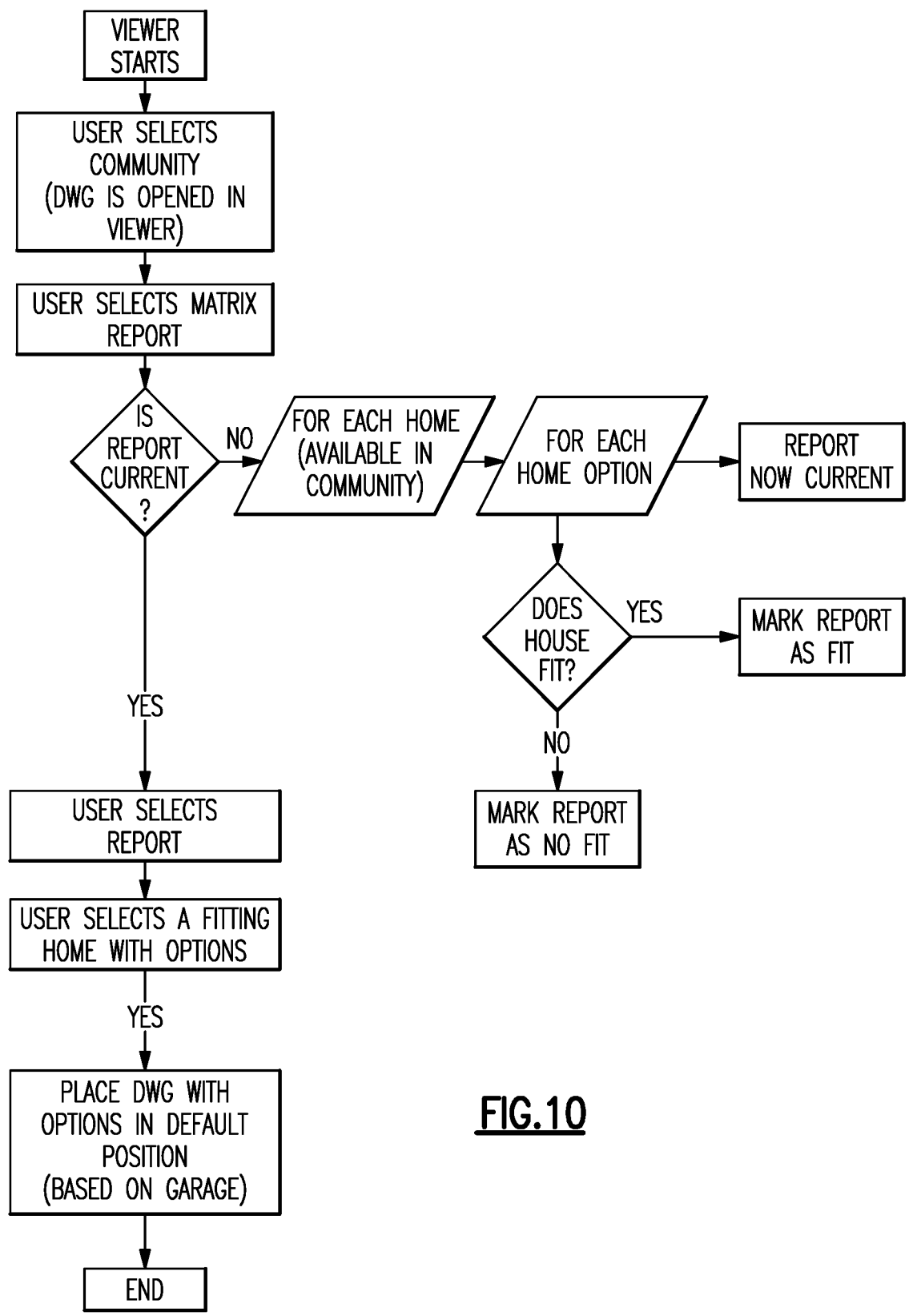
FIG. 10 illustrates a block diagram related to data of whether there is a fit or non-fit for each lot parcel that is saved in a report record matrix and that can be updated for available baseline building designs and building modification options.

Additionally or alternatively, the data of whether there is a fit or non-fit for each lot parcel may be maintained in a report record matrix that is saved in the memory 28 and updated for available baseline building designs and building modification options. An example is depicted in FIG. 10, in which the user selects a report matrix and the system or method then verifies whether the report matrix is current with respect to the existing baseline building designs and building modification options in the matrix versus the current building designs and building modification options available to the user. If the matrix is not current, the matrix is updated to include each baseline building design and building modification option for each lot parcel. The user can then subsequently view the matrix and/or select the baseline building design and building modification options that are a fit for a given lot parcel or parcels or interest.

The examples above may be further enhanced with additional functionalities to aid the user in the design and fitting process. As an example, the system may permit the user to designate on the display two points for measurement. In response to the designation of the two points, the display shows a numerical indication of the distance between the two points. Thus, on a display of a lot parcel with its permissible build envelope and the selected baseline building design with the selected building modification options, the user may use the measurement to better visualize distances from the home to the lot boundaries or other distances of potential interest. In that regard, the user can select multiple points and sets of points to display distance information of. Such distance data can be calculated from topographical data contained in the digital lot files that are saved in the memory 28. In addition to distance, the system can also provide elevation measurements between two points, which can be calculated from the topographical data in the digital lot files that are saved in the memory 28. For instance, the elevation change between the two points may be displayed on the graphic.

Another additional functionality may include landscaping. For instance, the user may be permitted to select from one or more menus to display graphics of various landscaping features, such as trees, shrubs, beds, and the like. Additionally, the landscaping can include graphics that represent child play structures, patios, decks, and the like.

In a further example, for a lot-fit determination across a group of lot parcels in a community, the display may also reflect predefined limiting conditions. Such conditions may be established in the method or system from a lookup table or matrix. The matrix is a database containing information of all the baseline building designs and modifications against all lot parcels within the community and can be used to determine which baseline building designs and modification combinations can fit on each lot parcel. The matrix may also include an image of the baseline building designs and modifications fitting or not fitting that can be used for reference. This may be a different matrix than described above, but most typically will be the same matrix.

A monotony rule or condition is one example. Monotony rules may be established in some communities by the community charter. A typical monotony rule prohibits homes of the same baseline building design to be built nearby each other, such as next to each other, within two lot parcels of each other, across the street from each other, or kiddie-corner from each other. In this regard, the matrix may contain monotony rule data and the display may indicate the fit and non-fit of the selected baseline building design with selected building modification options on all of the parcel lots that are off-limits because of a monotony rule. For instance, the system 20 limits the lot parcels that are used for the comparison to non-monotonous lot parcels that do not have immediately neighboring lot parcels that are designated in the memory 28 with the same baseline building design as the selected baseline building design (or alternatively, within two lot parcels, across the street, kiddie-corner, etc., depending on the given monotony rules). Such information may be contained in a lookup table or the matrix that is populated with lot parcel and home information. Any lot parcels that would violate the monotony rule can then be designated as off-limits, such as with a different color coding. Similar conditions may be imposed for other factors, such as whether a lot parcel is already sold or not. Sold lot parcels can be designed as off-limits, such as by color coding.

In a further example, the system 20 can also provide 3-dimensional renderings. To do this, the system must extract 2-dimensional information and then produce a 3-dimensional representation based on the 2-dimensional information. For example, elevation data is extracted from one or more of the digital lot files. One or more lot topographies is then generated for the one or more lot parcels based on the elevation data. A 3-dimensional graphic of the selected baseline building design with the selected building modification options is then displayed on the lot topography and within the permissible build envelope. Additionally, the selected baseline building design with the selected building modification options can be displayed at a specified baseline elevation on the lot given the topography. For instance, the community may regulate that the first floor or the basement of the building be at a specified elevation (baseline elevation) on the selected lot parcel. In that regard, the 3-dimensional graphic is displayed on the selected lot at the specified elevation, to provide the user with an accurate visual rendering of the selected baseline building design with the selected building modification options on the selected lot parcel.

The generation of a lot topography based on the elevation data may include extracting elevation data of the elevations at points on the boundaries or contours of a particular lot parcel. The elevation data is from cite surveys that generate elevation and contour measurements, and such data is then included in the site plan and, ultimately, in the digital lot file. The differences between the elevations can then be computed and the differences then used to render slopes between the elevation points. Such slopes can further be used to generate contour lines on the topography and depict a realistic view of the topography of one or more of the lot parcels. Moreover, the selected baseline building design with building modification options can also be depicted on the realistic view of one or more lot parcels, to give the user the ability to visually discern how the building is situated on the lot parcel.

For instance, the digital design files in the memory 28 may, in addition to the X and Y dimensions, include data for one or more vertical heights (Z) of the selected baseline building design with the selected building modification options. The heights (Z) may include, but are not limited to, the height of the selected baseline building design with the selected building modification options from the bottom of the basement or lowest floor to the top of the roof or to one or more higher floors, and/or heights from floor-to-floor. Coupled with the topographical elevation and baseline elevation of the building, the one or more heights (Z) are then used to calculate the elevation (vertical) locations at points around the perimeter of the selected baseline building design with the selected building modification options. This information can then be used to generate the 3-dimensional graphic of the selected baseline building design with the selected building modification options on the lot topography.

Figure 11:
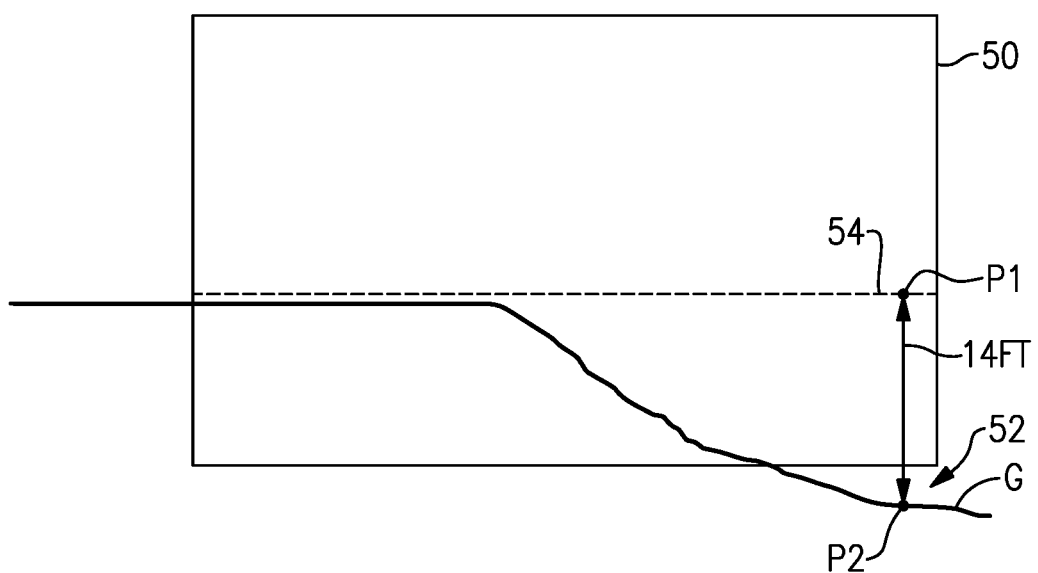
FIG. 11 illustrates a graphic showing a corner of a building cantilevered over the ground because of a steep elevation change, in which case the user can move the building on the envelope or select a different building that avoids the issue.

The 3-dimensional rendering of the selected baseline building design with the selected building modification options on the lot topography thereby also permits the user to visually identify potential issues related to topographical fit. For example, as shown in FIG. 11, the rendering may show that the back corner of the building 50 cantilevered over the ground (G), as depicted at 52, because of a steep elevation change at that location, in which case the user can move the building on the envelope or select a different building that avoids the issue.

An additional option can also be provided for manipulation of the grade of a selected lot parcel. The option may include features for calculating quantities of ground that will be generated by various types of grade changes. For instance, removal of portions of the ground and/or the addition of dirt or other filler may be required to help mitigate elevation problems with respect to a particular selected lot parcel and selected baseline building design and building modification options. The system can estimate the quantity of ground that should be removed from a designated area that requires an elevation reduction to a designated level and/or estimate the volume of soil or filler that is to be added to a designated area that requires an elevation increase to a designated level. Additionally, the option can be used to estimate the quantity of ground that will be generated from excavating below grade, such as for a basement, driveway, slab, etc., as well as generate an estimate of the quantity of ground generated by a manipulation of the grade of the selected lot parcel.

In a further example, the, baseline elevation, and topography information can also be used to determine and display the elevation difference between the elevation of a floor 54 (FIG. 11) of the selected building design and the ground. For example, the user designates a point P1 on the building, which may be a point on the perimeter of the building design as-placed in the permissible build envelope, and selects the elevation measurement, such as from a menu. The elevation difference between the point P1 and a point P2 on the ground G vertically below the point P1 is then shown in association with that point P1, which in this example is 14 feet. Such elevation changes can be calculated by calculating the difference between the height (Z) at which the floor 54 is at and the elevation of the ground at the location of the selected point P1.

It should also be noted that in a further example, the height or heights (Z) can be used as an additional factor in the determination of fit or non-fit, in addition to (X) and (Y) or in place of either (X) or (Y). For example, at periodic points around the perimeter of the selected baseline building design and building modification options the elevation of the lowest floor (e.g., first floor or basement) may be determined using the methodology as described above for point P1. If, at any point, the selected baseline building design and building modification options is off the ground, a non-fit is generated. If all points are on the ground or below ground, a fit is generated. The additional factor of using the height or height (Z) to determine fit may be provided as an option in the software, system, or method and may be toggled on/off by the user.

Additionally, a user can section the displayed 3-dimensional graphic of the selected baseline building design with the selected building modification options. This allows the user to see a cross-section of the home and what the elevation looks like at that cross-section. As the user changes, adds, or removes building modification options, the rendering of the 2-dimensional and 3-dimensional graphic of the building is updated in real time in the memory 28. Thus, the sectioned view of the building at any given time represents the current user selection of the baseline building design and building modification options.

Figure 12:
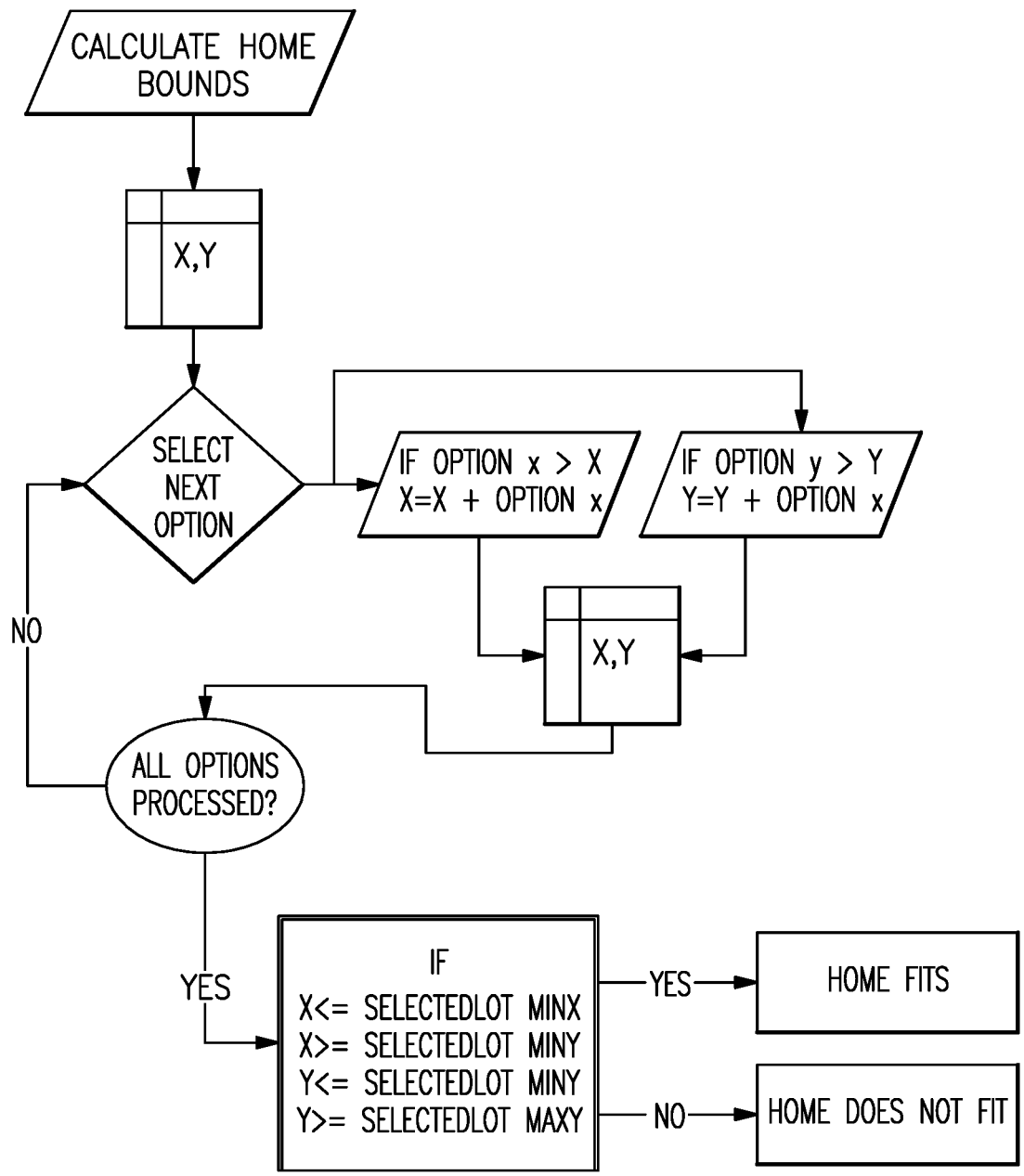
FIG. 12 illustrates a block diagram related to calculation of an as-modified footprint size for each baseline building design and building modification option to generate data of whether each option is a fit or non-fit on a selected lot parcel, wherein the fit or non-fit information can then be saved in a memory, such as in a matrix or lookup table.

As can be appreciated, the above examples are from the standpoint of first selecting the building design and options, followed by lot parcel selection based upon which lot parcels the selected building design fits. Alternatively, however, the process can begin with selection of a lot parcel, followed by selection of a baseline building design and building modifications that fit the permissible build envelope of an initially selected lot parcel. In one example, the process or system uses the same digital files as described above and includes permitting the user to select a lot parcel from the community of lot parcels, comparing the baseline footprint sizes to the permissible build envelope of the selected lot parcel and determining which one of the baseline building designs fits into the permissible build envelope, displaying a menu of the baseline building designs and permitting the user to select one of the baseline building designs, wherein the user is permitted to select only the baseline building design or designs that fit the permissible build envelope of the selected lot parcel, comparing the as-modified footprint sizes of the selected baseline building design to the permissible build envelope of the selected lot parcel and determining which ones of the as-modified footprint sizes fit into the permissible build envelope, displaying a menu of the building modification options and permitting a user to select one or more of the building modification options, wherein the user is permitted to select only the building modification options that have as-modified footprint sizes that fit the permissible build envelope of the selected lot parcel, and displaying on an electronic graphic the selected baseline building design with the selected building modification options within the one or more permissible build envelopes of the selected lot parcel. For example, FIG. 12 shows a block diagram, which is similar to 134 described above, in which the as-modified footprint size is calculated for each baseline building design and building modification option to generate data of whether each option is a fit or non-fit on a selected lot parcel. The fit or non-fit information can then be saved in the memory 28, such as in the matrix described herein or in a separate matrix or lookup table. The information can then be used to adjust the baseline building designs and building modification options that are presented to the user for a given lot. For instance, design and options that are a non-fit for a given lot are not presented such that the user is only able to select from designs and options that are a fit for the selected lot parcel.

In a further example, the user is permitted to initially select a lot parcel from an interactive map of the community and lot parcels. The interactive map may show which lots are available (unsold), which lots are unavailable (sold), and which building designs will fit in the lots. Again, this information may be extracted from the matrix as described herein. Additionally, the interactive map may indicate which building designs can be selected taking into consideration a monotony rule.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A system for dynamically determining lot-fit, comprising:
a computing device including at least a processor, an electronic graphic, and a memory, the computing device configured to:
display on the electronic graphic a menu of baseline building designs and permit a user to select one of the baseline building designs, the baseline building designs having corresponding digital design files saved in the memory, the digital design files including baseline footprint sizes of the baseline building designs;
display on the electronic graphic a menu of building modification options linked to the selected baseline building design and permit a user to select one of the building modification options, the digital design files including as-modified footprint sizes of the baseline building designs with each of the building modification options that is linked to the respective baseline building design;
using the processor to compare the as-modified footprint size of the selected building modification option for the selected baseline building design to one or more permissible build envelopes of one or more lot parcels, the lot parcels having corresponding digital lot files that are saved in the memory and contain the permissible build envelopes;
display on the electronic graphic whether the selected baseline building design with the selected building modification option fits within the one or more permissible build envelopes of the one or more lot parcels;
extract elevation data from one or more of the digital lot files, generate one or more lot topographies for the one or more lot parcels based on the elevation data, and display a three-dimensional graphic of the selected baseline building design with the selected building modifications on the one or more lot topographies and within the one or more permissible build envelopes;
generate the one or more lot topographies for the one or more lot parcels based on the elevation data by extracting from the elevation data elevations at points on a boundary or on a contour of the one or more lot parcels; and
compute a difference between the elevations, based on the difference render slopes between the elevations, generate contour lines of the one or more lot topographies, and depict a view of the one or more lot topographies on the electronic graphic.

2. The system as recited in claim 1, wherein the display includes graphics of the one or more permissible build envelopes, the one or more lot parcels, and the selected baseline building design with the selected building modification option, wherein the graphic of the selected baseline building design with the selected building modification option is in the one or more lot parcels.

3. The system as recited in claim 2, wherein the computing device is further configured to: permit a user to designate on the display at least one point, wherein in response to the designation of the at least one point, the display shows a numerical indication of an elevation of the at least one point.

4. The system as recited in claim 3, wherein the computing device is further configured to: permit a user to designate on the display two points, wherein in response to the designation of the two points the display shows a numerical indication of a distance between the two points.

5. The system as recited in claim 4, wherein the computing device is further configured to: display landscape graphics on the one or more lots.

6. The system as recited in claim 1, wherein the computing device is further configured to: display a menu of a plurality of the lot parcels, permit the user to select one of the lot parcels for the comparison with the as-modified footprint size, and display on the electronic graphic whether the selected baseline building design with the selected building modification option fits within the permissible build envelope of the selected lot parcel.

7. The system as recited in claim 1, wherein the one or more lot parcels is a plurality of the lot parcels, and the display on the electronic graphic includes graphics of the lot parcels and, for each said lot parcel, an indicator of whether the selected baseline building design with the selected building modification option fits within the permissible build envelope of the respective lot parcel.

8. The system as recited in claim 7, wherein the computing device is further configured to: display a graphic of the selected baseline building design with the selected building modification option within one of the permissible build envelopes of one of the lot parcels and permit the user to graphically change lot parcels by dragging the graphic of the selected baseline building design with the selected building modification option from a first one of the lot parcels and dropping it onto a second one of the lot parcels.

9. The system as recited in claim 8, wherein the computing device is further configured to: in response to the dropping of the selected baseline building design with the selected building modification option, compare the as-modified footprint size of the selected building modification option for the selected baseline building design to the permissible build envelope of the second lot parcel and then refresh the electronic graphic to display whether the selected baseline building design with the selected building modification option fits within the permissible build envelope of the second lot parcel.

10. The system as recited in claim 1, wherein the display includes graphics of the one or more permissible build envelopes, the one or more lot parcels, and the selected baseline building design with the selected building modification option, wherein the graphic of the selected baseline building design with the selected building modification option is in the one or more lot parcels, and if the selected baseline building design with the selected building modification option does not fit within the one or more permissible build envelopes of the one or more lot parcels, the display includes a visual marker at any location where the selected baseline building design with the selected building modification option exceeds the one or more permissible build envelopes of the one or more lot parcels.

11. The system as recited in claim 1, wherein the computing device is further configured to: limit the one or more lot parcels that are used for the comparison to non-monotonous lot parcels that do not have immediately neighboring ones of the lot parcels that are designated in the memory with the same baseline building design as the selected baseline building design.

12. The system as recited in claim 1, wherein the computing device is further configured to: permit the user to adjust an elevation of the selected baseline building design with the selected building modifications with respect to one or more of the lot topographies, and then display the three-dimensional graphic of the selected baseline building design with the selected building modifications on the one or more lot topographies at the adjusted elevation and within the one or more permissible build envelopes.

13. The system as recited in claim 1, wherein the computing device is further configured to: determine whether a lowest floor of the selected baseline building design with the selected building modification option is above grade on the one or more lot parcels and display on the electronic graphic whether the selected baseline building design with the selected building modification option is above grade on the one or more lot parcels.

* * * * *